US008144329B2

(12) United States Patent
Cruse et al.

(10) Patent No.: US 8,144,329 B2
(45) Date of Patent: Mar. 27, 2012

(54) LOW POWER RF TUNING USING OPTICAL AND NON-REFLECTED POWER METHODS

(75) Inventors: James P. Cruse, San Jose, CA (US); Theresa Kramer Guarini, San Jose, CA (US); Jeffrey Charles Pierce, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/177,442

(22) Filed: Jul. 6, 2011

(65) Prior Publication Data
US 2011/0263050 A1 Oct. 27, 2011

Related U.S. Application Data

(60) Division of application No. 12/889,286, filed on Sep. 23, 2010, now abandoned, which is a continuation of application No. 11/427,318, filed on Jun. 28, 2006, now abandoned.

(51) Int. Cl.
*G01N 21/55* (2006.01)
(52) U.S. Cl. ............ 356/445; 356/448
(58) Field of Classification Search .......... 356/72, 356/445–448, 316, 326, 311; 700/108, 110, 700/116, 117, 121; 438/7–11, 17, 711, 14–16, 438/714, 408, 689; 156/346–348, 345.24–345.51, 156/647, 638; 216/67–71, 59–63; 204/298.32, 204/298.03; 134/65 R, 1.1–1.3, 57 R, 37, 134/902

See application file for complete search history.

(56) References Cited

U.S. PATENT DOCUMENTS

| | | | |
|---|---|---|---|
| 5,407,524 A | 4/1995 | Patrick et al. | |
| 5,571,366 A | 11/1996 | Ishii et al. | |
| 6,160,621 A | 12/2000 | Perry et al. | |
| 6,351,683 B1 | 2/2002 | Johnson et al. | |
| 6,627,463 B1 | 9/2003 | Sarfaty | |
| 6,843,881 B2 | 1/2005 | Kim et al. | |
| 2004/0097089 A1 | 5/2004 | Ohmi et al. | |
| 2005/0009347 A1 | 1/2005 | Matsumoto et al. | |
| 2006/0042546 A1 | 3/2006 | Ishii et al. | |
| 2011/0011743 A1 | 1/2011 | Cruse et al. | |

FOREIGN PATENT DOCUMENTS

KR 20050031457 A 4/2005

OTHER PUBLICATIONS

Korean Office Action dated Jul. 15, 2010 corresponding to Korean Patent Application 10-2008-7026134. (APPM/010360KRP).
Chinese Office Action dated Dec. 18, 2009 for Chinese Patent Application No. 200780015059.6 (APPM/010360 CN).
International Search Report and Written Opinion of the International Searching Authority mailed Sep. 4, 2008 in PCT/US07/69609.

*Primary Examiner* — Tri T Ton
(74) *Attorney, Agent, or Firm* — Patterson & Sheridan, L.L.P

(57) ABSTRACT

Aspects of the present invention include methods for controlling a plasma in a substrate processing system. One embodiment provides controlling a first set of wavelength intensities of reflected electromagnetic radiation reflected from the plasma within a chamber before processing a first set of one or more substrates, associating the first set of wavelength intensities of reflected electromagnetic radiation to an RF power within the processing system, adjusting a matching circuit based on the first set of wavelength intensities of reflected electromagnetic radiation, processing the first set of one or more substrates in the substrate processing system, controlling a second set of wavelength intensities of reflected electromagnetic radiation reflected from the plasma within the chamber, and associating the second set of wavelength intensities of reflected electromagnetic radiation to the RF power within the processing system.

18 Claims, 7 Drawing Sheets

LOW POWER RF TUNING USING OPTICAL AND NON-REFLECTED POWER METHODS

CROSS-REFERENCE TO RELATED APPLICATIONS

This application is a divisional of U.S. patent application Ser. No. 12/889,286, filed Sep. 23, 2010 now abandoned, which is a continuation of U.S. patent application Ser. No. 11/427,318, filed Jun. 28, 2006 now abandoned, both of which are hereby incorporated by reference herein.

BACKGROUND OF THE INVENTION

1. Field of the Invention

The present invention relates generally to methods and apparatuses for use in substrate processing. More specifically, the present invention relates to plasma monitoring methods and apparatuses for use in substrate processing using different processes, such as a plasma nitridation process and others.

2. Description of the Related Art

Integrated circuits have evolved into complex devices that can include millions of components (e.g., transistors, capacitors, resistors, and the like) on a single chip. The evolution of chip designs continually requires faster circuitry and greater circuit density. The demands for greater circuit density necessitate a reduction in the dimensions of the integrated circuit components. The minimal dimensions of features of such devices are commonly referred to in the art as critical dimensions. The critical dimensions generally include the minimal widths of the features, such as lines, columns, openings, spaces between the lines, and device/film thickness and the like. As these critical dimensions shrink, accurate measurement and process control becomes more difficult.

Importantly, in some cases, monitoring of implantation processes and controlling material thickness remain to be a challenge in substrate device processing. For example, one problem associated with a conventional plasma process used in the manufacture of substrates is the lack of an ability to accurately monitor the formation of plasma and thereby accurately controlling the plasma state in a plasma chamber operating with lower powers. One known method used to control a process attempts to achieve optimum power in a chamber by using a match circuit to transform the impedance of the plasma to a value that equals or matches the characteristic impedance of the line through which RF power is delivered to the chamber. At the match point, optimum power is delivered into the plasma and little power is reflected back toward the RF supply. In this method, tuning the match circuit, which is controlled by a detector, is accomplished by varying the variable reactance elements within the match circuit based on the power detected by a detector. Unfortunately, the impedance of plasma is a complex and highly variable function of many process parameters and thus requires constant monitoring and adjustment by the detector. In addition, in some cases, the generator may not be capable of controlling lower powers and thus the plasma may fluctuate during substrate processing.

Therefore, there is a need in the art for an improved method and apparatus for substrate monitoring and process control during the manufacture of integrated circuits.

SUMMARY OF THE INVENTION

Aspects of the present invention include methods for controlling a plasma in a substrate processing system. One embodiment provides controlling a first set of wavelength intensities of reflected electromagnetic radiation reflected from the plasma within a chamber before processing a first set of one or more substrates, associating the first set of wavelength intensities of reflected electromagnetic radiation to an RF power within the processing system, adjusting a matching circuit based on the first set of wavelength intensities of reflected electromagnetic radiation, processing the first set of one or more substrates in the substrate processing system, controlling a second set of wavelength intensities of reflected electromagnetic radiation reflected from the plasma within the chamber, associating the second set of wavelength intensities of reflected electromagnetic radiation to the RF power within the processing system, and adjusting the matching circuit based on the first or the second set of wavelength intensities of reflected electromagnetic radiation, while processing a second set of one or more substrates.

Another embodiment of the present invention provides a method for controlling a plasma in a substrate processing system. The method includes generating a plasma within a chamber by applying RF power to one or more coil elements disposed outside of the chamber, controlling a first set of wavelength intensities of reflected electromagnetic radiation reflected from the plasma within the chamber before processing a first set of one or more substrates, associating the first set of wavelength intensities of reflected electromagnetic radiation to an RF power within the processing system, adjusting a matching circuit based on the first set of wavelength intensities of reflected electromagnetic radiation, processing the first set of one or more substrates in the substrate processing system, controlling a second set of wavelength intensities of reflected electromagnetic radiation reflected from the plasma within the chamber, associating the second set of wavelength intensities of reflected electromagnetic radiation to the RF power within the processing system, and adjusting the matching circuit based on the first or the second set of wavelength intensities of reflected electromagnetic radiation, while processing a second set of one or more substrates, wherein the adjusting the matching circuit comprises adjusting one or more capacitors coupled to the one or more coil elements.

Another embodiment of the present invention provides a method for controlling a plasma in a substrate processing system. The method includes monitoring the plasma in a chamber from a position outside of the chamber utilizing a plasma data monitoring system, controlling a first set of wavelength intensities of reflected electromagnetic radiation reflected from the plasma within the chamber before processing a first set of one or more substrates, associating the first set of wavelength intensities of reflected electromagnetic radiation to an RF power within the processing system, adjusting a matching circuit based on the first set of wavelength intensities of reflected electromagnetic radiation, processing the first set of one or more substrates in the substrate processing system, controlling a second set of wavelength intensities of reflected electromagnetic radiation reflected from the plasma within the chamber, associating the second set of wavelength intensities of reflected electromagnetic radiation to the RF power within the processing system, and adjusting the matching circuit based on the first or the second set of wavelength intensities of reflected electromagnetic radiation, while processing a second set of one or more substrates.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be

DETAILED DESCRIPTION

Embodiments of the present invention provide methods and apparatuses that may be utilized to monitor and adjust the plasma in a substrate processing system by using a plasma data monitoring assembly, such as an optical instrument adapted to measure properties of light over a portion of the electromagnetic spectrum. For example, in one embodiment, a method may be realized by utilizing wavelength intensities sensitive to RF power that are generated within a chamber. Then, an electronic device, for example, a computer software, may analyze the wavelength intensities and a match circuit may then be adjusted. In this way, consistent (i.e., repeatable) plasma condition may be obtained. In other embodiments, the present invention may utilize the relationship between chamber pressure, substrate temperature, coil currents, electron-neutron ratio, electron density, electron energy and/or the plasma in order to adjust and maintain a consistent plasma process.

While the following description of the system is described with reference to a plasma processing chamber (e.g., a Plasma Nitridation Chamber), the same techniques may be applied to other applications and systems, such as substrate etch chambers and others, wherein plasma is generated.

Although, the present invention is described with reference to a plasma nitridation chamber (e.g., Decoupled Plasma Nitridation (DPN) chamber), it is to be noted that the plasma of the plasma nitridation process may be generated by various ionizing power sources, which may, for example, include an inductively coupled power source, a capacitatively coupled power source, a surface wave power source, an electronic cyclotron resonance source (ECR source), magnetron or modified magnetron-type sources, or other sources that may be used to facilitate plasma generation in a processing chamber.

Figure 1:
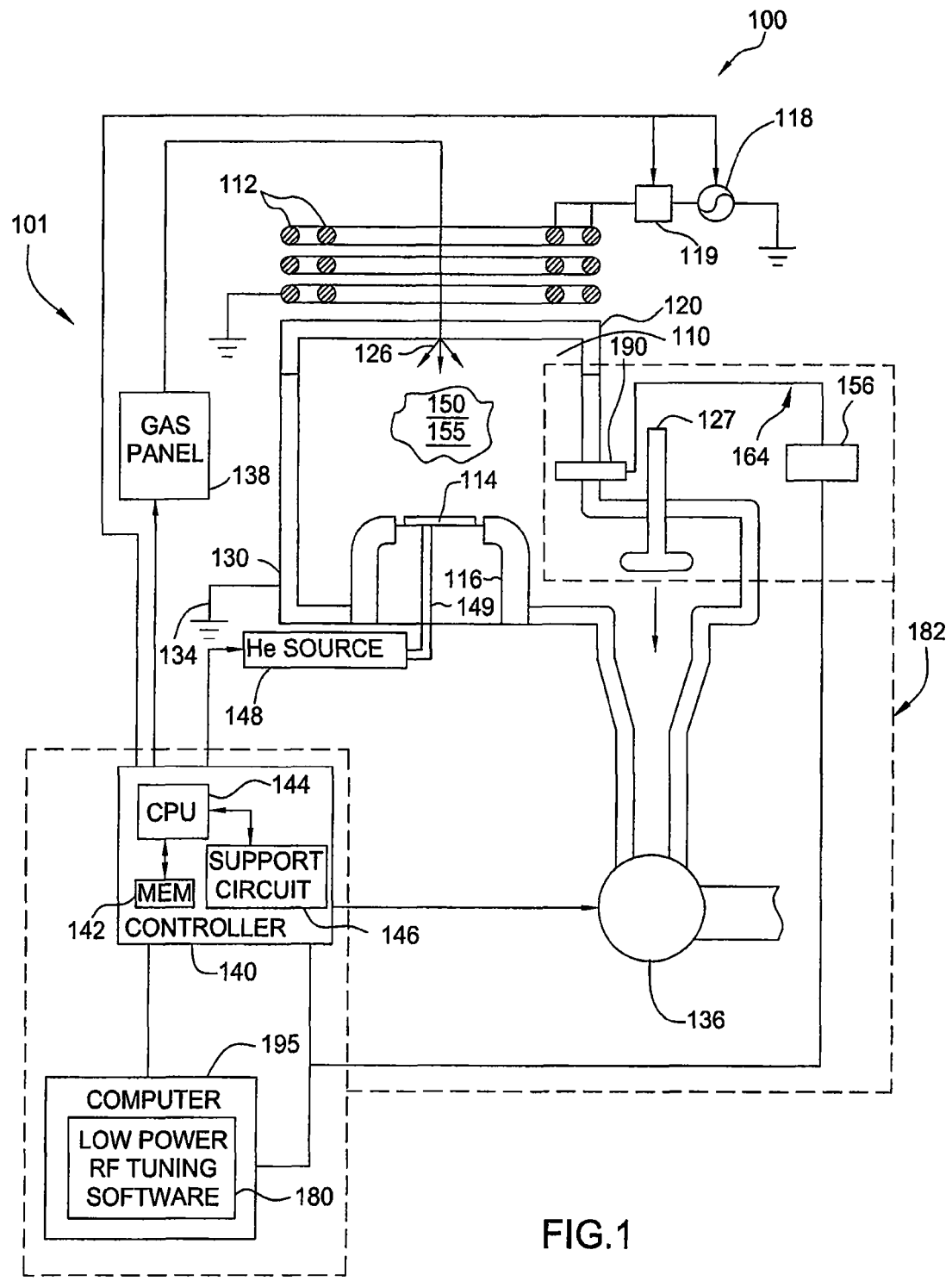
FIG. 1 illustrates an exemplary schematic diagram of a processing system having one embodiment of the present invention.

FIG. 1 illustrates a schematic, cross-sectional diagram of one illustrative embodiment of a substrate processing system 100 for fabricating integrated devices suitable for use with the present invention. The substrate processing system 100 generally includes a plasma processing module, such as a reactor module 101. One illustrative embodiment of a reactor module 101 that can be used to perform the steps of the present invention is a Decoupled Plasma Nitridation (DPN) process reactor, made by Applied Materials located in Santa Clara, Calif.

In one embodiment, the reactor module 101 includes a process chamber 110, a Radio Frequency (RF) power source 118 (e.g., plasma power source), and a controller 140. The process chamber 110 may also include a substrate support pedestal 116 within a body (wall) 130, which may be made of a conductive material. The chamber 110 is supplied with a dielectric ceiling 120. In the depicted embodiment, the ceiling 120 is substantially flat. Other embodiments of the process chamber 110 may have other types of ceilings, e.g., a curved or domed ceiling. A lid (not shown) may be additionally provided to house and protect additional components of the reactor 101 as well as form a shield for RF radiation. Above the ceiling 120 is disposed an antenna comprising at least one inductive coil element 112 (two co-axial elements 112 are shown). The inductive coil element 112 is coupled, through a first matching network (e.g., match circuit(s)) 119, to an RF power source 118. In other embodiments, the reactor module 101 may include a plurality of match circuits each having one or more outputs connecting to the coil element 112. In another embodiment, the match network 119 may have a single output connecting to the coil element 112. In any case, the plasma source 118 typically is capable of producing up to 3000 W at 13.56 MHz.

A controller 140 is coupled to the various components of the substrate processing system 100 to facilitate control of, for example, the processing, monitoring plasma, adjusting the power and frequency of the power supply and other automated functions as described herein. The controller 140 may include a central processing unit (CPU) 144, a memory 142, and support circuits 146 for the CPU 144. The controller may facilitate control of the components of the chamber 110 and the nitridation process. The controller 140 may be one of any form of general-purpose computer processor that can be used in an industrial setting for controlling various chambers and sub-processors. The memory 142, or computer-readable medium of the CPU 144 may be one or more of readily available memory such as random access memory (RAM), read only memory (ROM), floppy disk, hard disk, or any other form of digital storage, local or remote. The support circuits 146 are coupled to the CPU 144 for supporting the processor in a conventional manner. These circuits include cache, power supplies, clock circuits, input/output circuitry and subsystems, and the like. The inventive method may be stored in the memory 142 as a software routine (e.g., low power RF tuning software). The software routine may also be stored and/or executed by a second CPU (not shown) that is remotely located from the hardware being controlled by the CPU 144. Alternatively, in another embodiment, the inventive method may be stored in computer 195 and/or controller 140.

In a basic operation (e.g., a substrate implant operation), a substrate 114 is placed on the pedestal 116 and process gases are supplied from a gas panel 138 through entry ports 126 to form a gaseous mixture 150. The gaseous mixture 150 is ignited into a plasma 155 in the chamber 110 by applying power from the plasma source 118 to the inductive coil element 112. The pressure within the interior of the chamber 110 is controlled using a throttle valve 127 and a vacuum pump 136. Typically, the chamber wall 130 is coupled to an electrical ground 134. The temperature of the wall 130 is controlled using liquid-containing conduits (not shown) that run through the wall 130.

The temperature of the substrate 114 may be controlled by stabilizing a temperature of the support pedestal 116. In one embodiment, helium gas from a gas source 148 is provided via a gas conduit 149 to channels (not shown) formed in the pedestal surface under the substrate 114. The helium gas is used to facilitate heat transfer between the pedestal 116 and the substrate 114. During processing, the pedestal 116 may be heated by a resistive heater (not shown) within the pedestal to a steady state temperature and then the helium gas facilitates uniform heating of the substrate 114. Using such thermal control, the substrate 114 may be maintained at a temperature between about 20 to 350 degrees Celsius.

The RF power source may operate at any suitable frequency, for example, 13.56 MHz. In one embodiment, the power is operated at radio frequency and the power modulation frequency may be typically turned on and off at KHz frequencies. For example, in one embodiment, the RF power source 118 may continuously operate at 13.56 MHz while the RF power source 118 may be pulsed at a frequency of about 1 KHz to about 50 KHz. In other embodiments, the RF power source 118 may continuously operate without pulsing. The peak RF power is typically set between about 50 watts to about 3000 watts. In some embodiments, effective power (duty cycle multiplied by the source power) may range from about 10 watts to about 30 watts. The duty cycle of the modulations (or pulses) may be between about 2% to about 90% and the ionizing power may be varied between about 0% and about 100% to generate the desired mean temperature of the constituents of the plasma. It is contemplated that a Direct Current power source (DC power source) may be utilized in some embodiments of the present invention.

In one embodiment, a nitrogen-containing gas, such as $N_2$ or $NH_3$ at a flow rate of about 50 sccm to about 20 slm may be introduced to the chamber for processing a substrate located within the chamber. In addition to the nitrogen-containing gas, an inert gas, such as He, Ar, Ne (neon), Kr (krypton) or Xe (xenon), may be used to sustain the plasma and to modify the electron temperature within the chamber. In one embodiment, the inert gas flow rate is between about 0 sccm and about 20 slm. The plasma nitridation process is typically operated at pressure between about 1 mTorr to about 1 Torr.

In order to monitor and adjust the plasma generated by a low power RF device (e.g., RF power source 118), the present invention may utilize a device, which is capable of detecting the electromagnetic radiation generated by a plasma within the chamber. Electromagnetic radiation may be a visible light, infrared light, UV light and the like.

In one embodiment, a monitoring system 182 is capable of detecting the radiated electromagnetic radiation by utilizing interferometry. In another embodiment, the monitoring system 182 is adapted to monitor the plasma by utilizing spectroscopy (e.g., optical spectroscopy). In one embodiment, the monitoring system 182 detects a single wavelength of electromagnetic radiation from the plasma. In other embodiments, the monitoring system 182 may detect a plurality of wavelengths of electromagnetic radiation with various intensities from the plasma. In some aspects, detecting a plurality of wavelengths of electromagnetic radiation may be used advantageously, since the detected electromagnetic radiation waves may behave differently for different wavelengths when monitoring the plasma. In one embodiment, electromagnetic radiation waves having wavelengths of between about 200 nm and about 800 nm and in some cases, between 800 nm and 1700 nm, may be used depending on the sources used to generate a plasma within the chamber. In other embodiments, an average of a plurality of wavelengths may be used to monitor the plasma and yet in other embodiments, one or more wavelengths in addition to one or more non-RF related parameters may be utilized to monitor and/or control the plasma. The monitoring system 182 is capable of using non-reflective RF parameters, spectral and non-spectral parameters in order to monitor and control the plasma.

Depending on the species of gases (e.g., nitrogen) used to generate plasma, a particular wavelength may be selected to monitor the plasma. For example, for a $1^{st}$ neg $N_2^+$, an optical filter may be used in order to detect and monitor wavelengths of about 337.13 nm or of about 391.44 nm. Alternatively, for a $1^{st}$ pos $N_2$, a wavelength of about 590.60 nm or of about 601.36 nm is monitored. Examples of typical gases that may be used for plasma processing may include $N_2$, $H_2$, He, $O_2$, $CO_2$, $CH_4$ and the like. Thus, the selected wavelengths may vary.

In one embodiment, the monitoring system 182 may include a spectrometer 156, a sensor 190 and a computer 195. In one embodiment, the computer 195 and controller 140 may be one and the same. However, in one embodiment, the controller 140 is used for controlling the chamber activities, while, the computer 195 is used for controlling the plasma monitoring, data collection and analysis. The computer 195 may include a low power RF tuning module (e.g., low power RF tuning software 180). The low power RF tuning software 180 may include an executable program module, for example a Dynamic Link Library (DLL) that performs one or more low power RF tuning functions at runtime. The low power RF tuning software 180 may also be stored and/or executed by a second CPU (not shown) that is remotely located from the hardware being controlled by the computer 195. In another embodiment, the low power RF tuning software 180 may be stored in controller 140 and/or computer 195. In other embodiments, the low power RF tuning software 180 may be located in spectrometer 156 or RF power source 118 or in the match network 119. Alternatively, the low power RF tuning software may be included in one or more computers placed within any of the substrate processing's subsystems such as RF power source 118 and the like.

Figure 2:
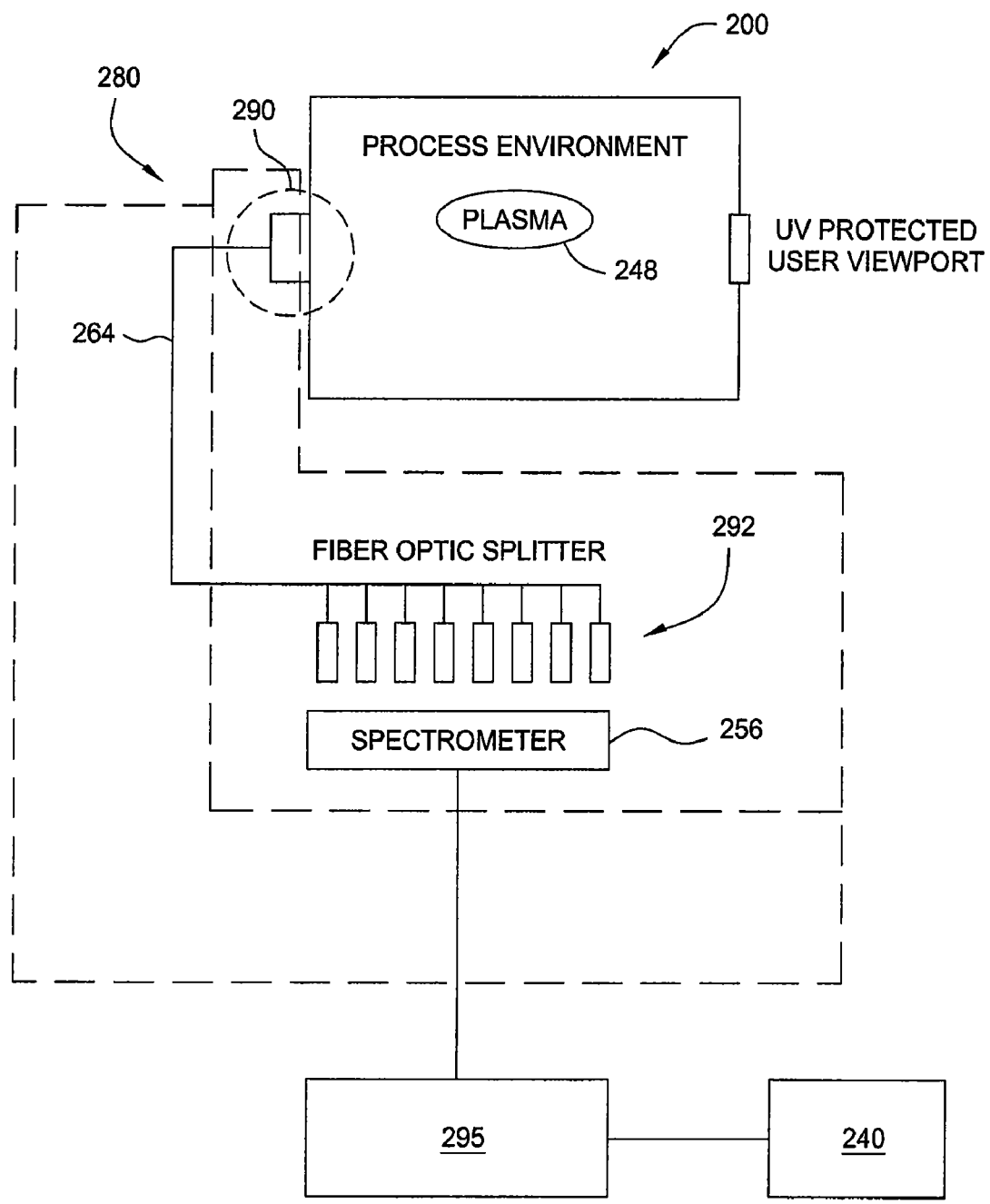
FIG. 2 illustrates another exemplary schematic diagram of a processing system with an sensor for plasma monitoring.
Figure 3:
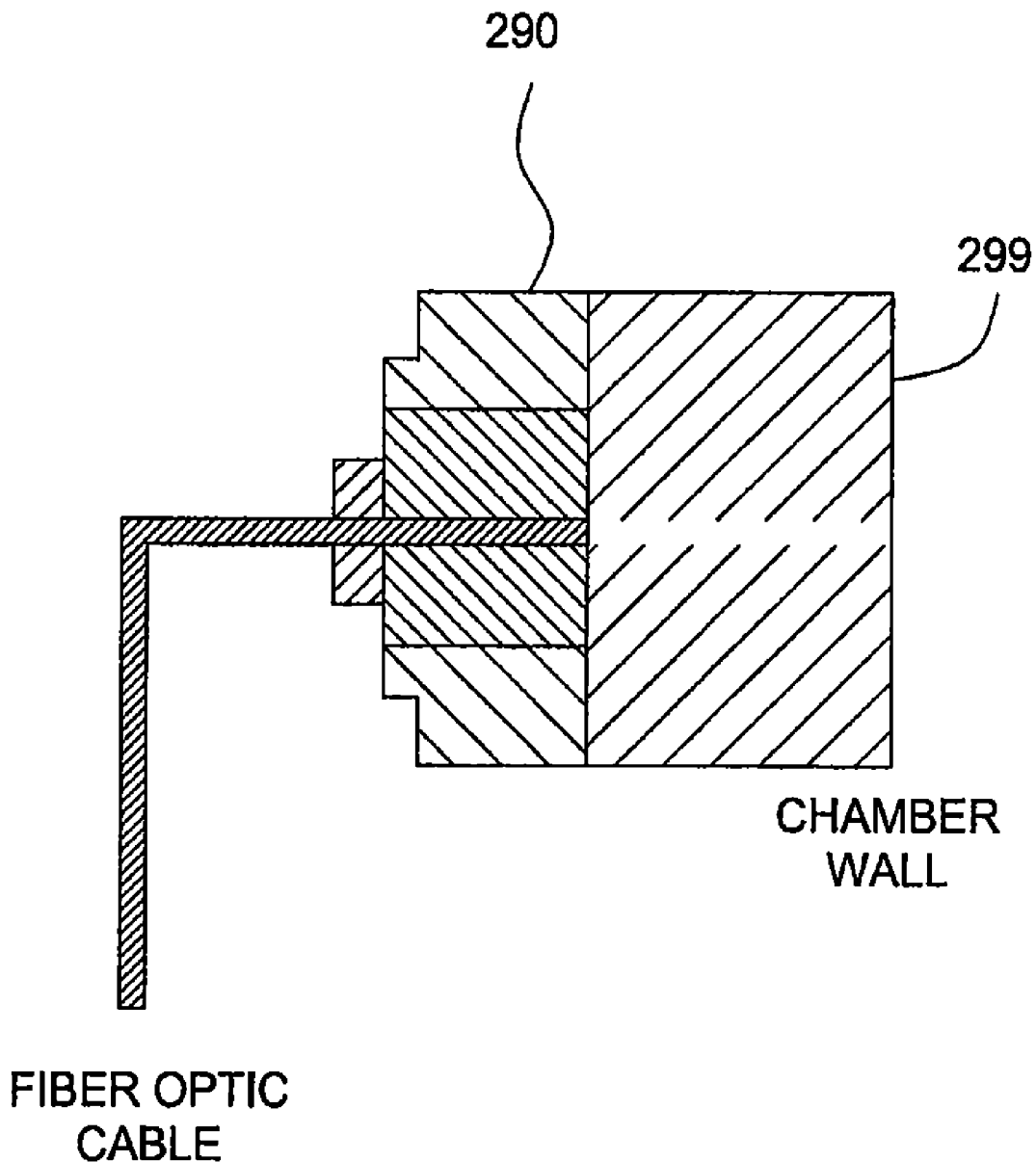
FIG. 3 illustrates a cross section of the chamber wall of the system of FIG. 2 having an optical sensor.

FIG. 2 illustrates one embodiment of the present invention with an exemplary schematic diagram of a processing system (processing system 200) with an optical port sensor for plasma monitoring. As shown, a monitoring system 280 may utilize a spectrometer 256 to collect the radiation from the generated plasma within the chamber. A fiber optical splitter 292 may split the radiation into discrete wavelengths, and detect the intensity of the radiation at each discrete wavelength. In one embodiment, the spectrometer 256 may include an input slit, a diffraction grating (or optical prism), a diffraction grating controller and a detector array to collect the incoming radiation. In one embodiment the spectrometer 256 is used to scan across a range of wavelengths of the emitted radiation as a function of time to monitor and control the process. A sensor 290 is adapted to detect a plurality of wavelengths. Suitable sensors used to measure the various wavelengths may include the following classes of sensors, for example, a photovoltaic, a photoconductive, a photoconductive-junction, a photoemissive diode, a photomultiplier tube, a thermopile, a bolometer, a pyroelectric sensor or other like detectors. When using sensor detectors of this type, it may be advantageous to use filters to limit desired wavelengths that are detected. In one embodiment as shown in FIG. 3, sensor 290 may be placed next to a window such that it is in direct view of plasma region through a chamber wall 299. Alternatively, a sensor may be inserted or it may be fully enclosed within the processing chamber (not shown). In either case, a fiber optic cable may be used to transfer the detected signals to a controller, for processing, in order to obtain desired processing data used to control the plasma.

In one embodiment, the optical interface between the sensor device 290 and the spectrometer 256 may be provided using a fiber-optic array 264. The fiber optic array 264 is generally a bundle of optical fibers (detector fibers) that are connected to the spectrometer 256. In one embodiment, the fiber optic array 264 has a combined diameter of about 0.2 millimeters to about 1 millimeter. The size of the fibers may also vary to assist in the collection of the reflected light. For example, the detector fibers connected to the spectrometer 256 may have a diameter of about 300 microns. In another embodiment, the fiber optic array 264 may include a single source fiber or an array of source fibers coupled to the spectrometer 256 without the need for separate detector fibers.

In operation, light reflected from the illuminated region (the plasma) 248 is detected and guided by the detector 290 to the spectrometer 256. The spectrometer 256 detects a broad spectrum of wavelengths of light, enabling the intensities of the plasma to be observed using a wavelength having a strong reflectance signal and/or using multiple wavelengths. It is contemplated that, more generally, any analyzer capable of analyzing the reflected light is used to provide data via a serial cable to the computer 295.

Although only one spectrometer is illustrated in FIG. 2, it is contemplated that in other embodiments, one or more fixed spectrometers and/or one or more variable spectrometers or a combination thereof may be integrated within the substrate processing system 100 for plasma monitoring.

In one embodiment, output from the spectrometer 256 is delivered to the computer 295 or to the controller 240 for analysis and may be used as data to monitor and adjust the plasma within the chamber as discussed herein. The computer 295 may be a general purpose computer or a special purpose computer and generally is configured with similar components as used by the controller 240 described above. In one embodiment, the output from the computer 295 is delivered to the controller 240 so that necessary process adjustments may be made. In another embodiment, the computer 295 and controller 240 may be the same device, containing all the required software and hardware components necessary to control the process and analyze the spectral information. In either case, the controller 240 or the computer 295 or any other computers embedded within the processing system may be adapted to include a low power RF tuning module (e.g., low power RF tuning software) for monitoring a process and in particular, for low power RF tuning as discussed below.

Figure 4:
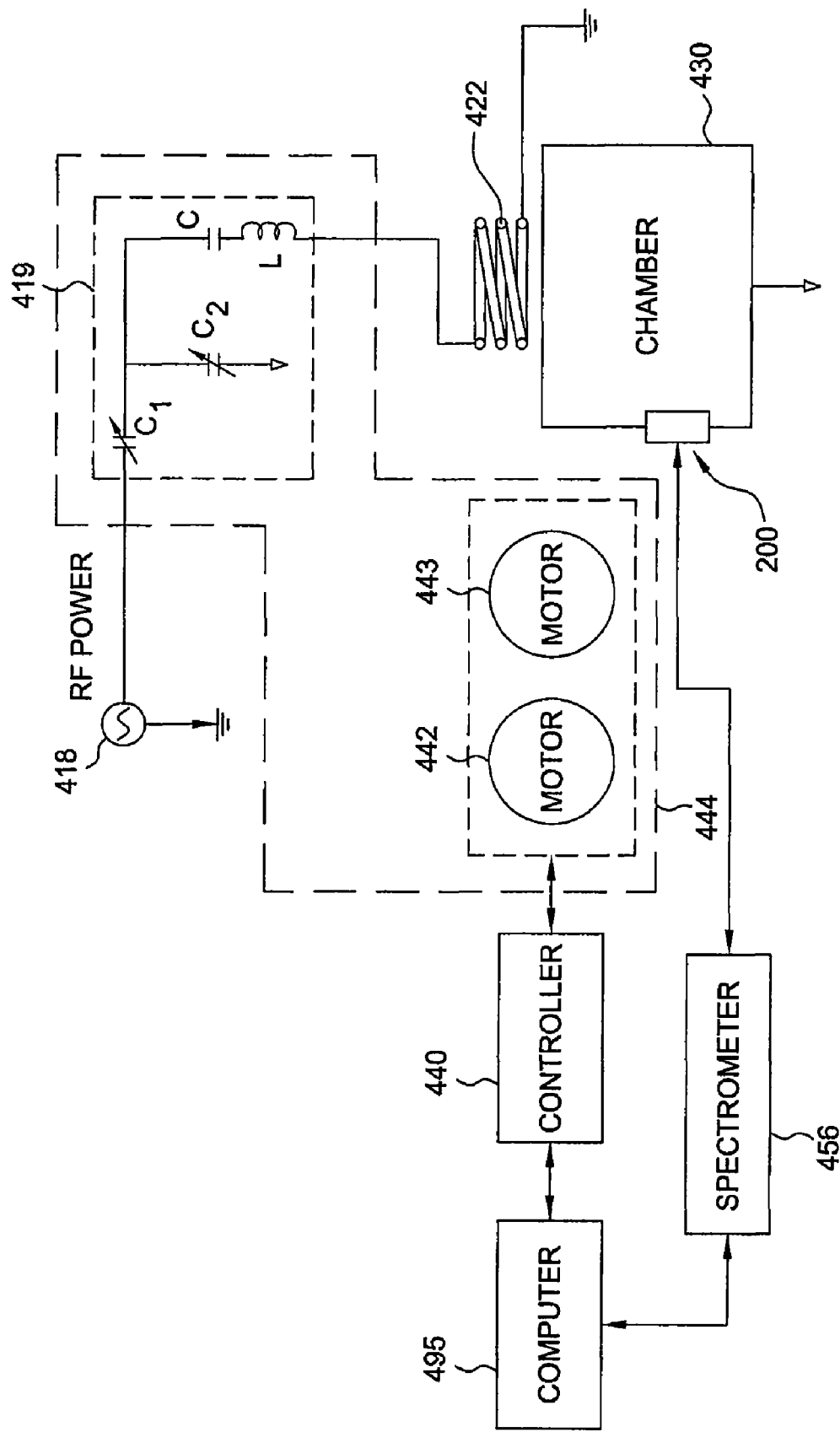
FIG. 4 illustrates a schematic of the tuning circuit in communication with a spectrometer according to an embodiment of the present invention.

FIG. 4 illustrates a schematic of the tuning circuit in communication with a spectrometer according to an embodiment of the present invention. As shown, an RF match section 419 includes a variable capacitor $C_1$ connected in series to an input capacitor C and an input inductor L with RF input 422. The RF match section may also include a second variable capacitor $C_2$ which is connected across the capacitor $C_1$ and ground. The capacitance of $C_1$ and/or $C_2$ may be intentionally and repeatedly changed by motors 442, and 443 of a servo unit 444. In other embodiments, both capacitors $C_1$ and $C_2$ may include movable capacitance plates such that the orientation of which are controlled by motors 442 and 443 of a servo unit 444. A controller 440, in communication with a low power RF tuning module and computer 495, coupled to the servo unit and the spectrometer 456, monitors the generated plasma within the chamber and based on the reflected intensity, controls the operation of motors 442 and 443. In this way, the controller controls the values of the variable capacitors $C_1$ and $C_2$. For example, in one embodiment, the controller may adjust these values to provide for a maximum intensity for a particular wavelength in order to ensure that a consistent plasma is generated. It is also noted that the match circuit may include other elements (e.g., other reactance elements), in addition to the elements shown in FIG. 4.

In other embodiments, a plurality of match circuits in communication with one or more motors may be utilized to maintain a consistent plasma. In addition, it is contemplated that the match circuit(s) may be located in RF power source 418. In other embodiments, the frequency of the RF power source may be varied instead of varying the capacitance of the match circuit in order to tune the adjusted in order to control the plasma in the chamber. For example, in one embodiment, the frequency of the RF power source 418 may be varied from 13.56 MHz to up to about 13.6 MHz or down to about 13.5 Mhz in order to adjust the plasma in the chamber. It is also contemplated that the controller may control the values of the variable capacitors $C_1$ and $C_2$ of the match circuit in addition to the frequency of the RF power source to maintain a consistent plasma.

Figure 5:
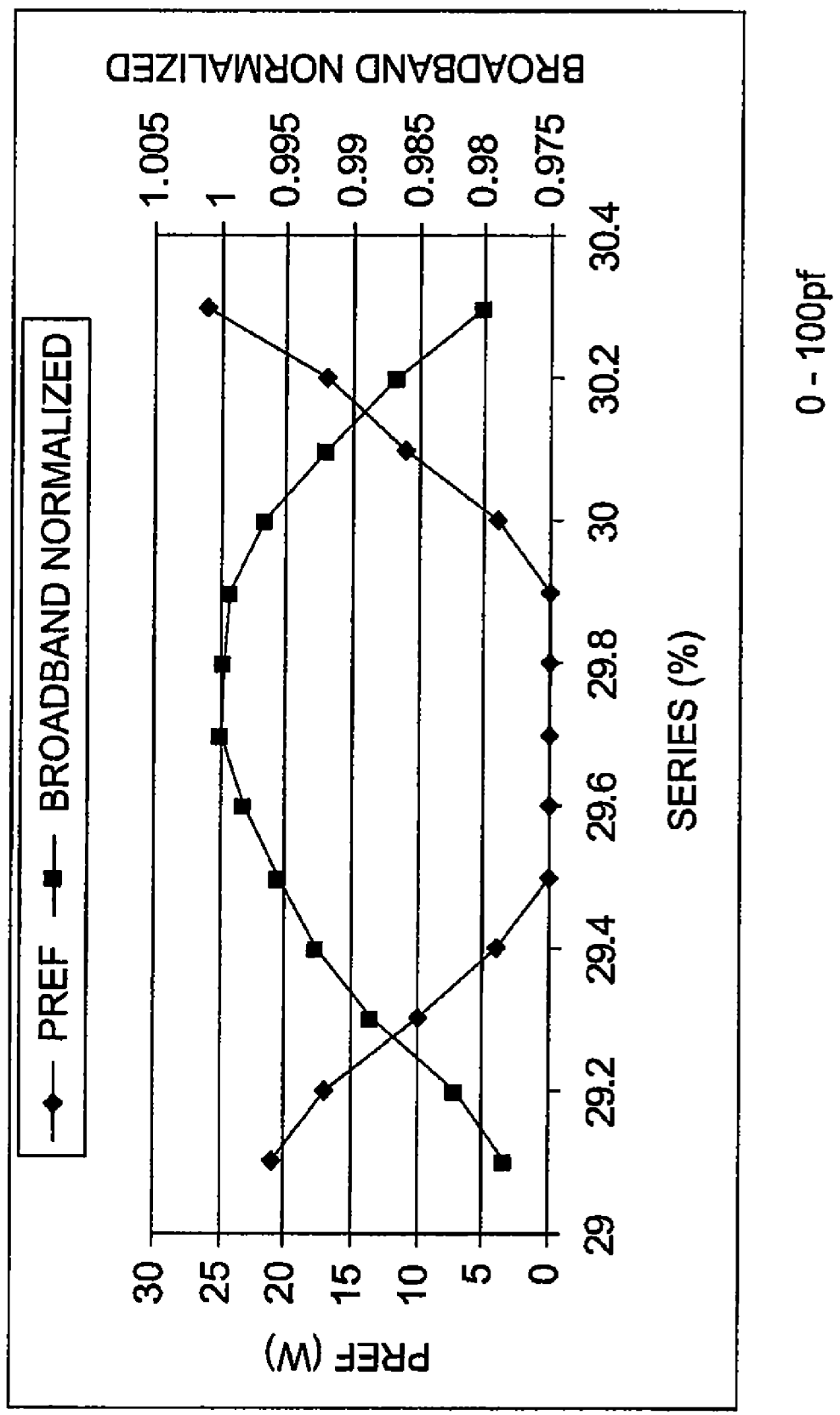
FIG. 5 illustrates a diagram of a match peak find according to an embodiment of the present invention.

FIG. 5 illustrates a diagram of a match peak find according to an embodiment of the present invention. As illustrated, a normalized broadband wavelength is compared with reflected power (Pref (W)) and accordingly, a series capacitor is varied. The low power RF tuning software is adapted to select series values that provide for a maximum normalized broadband wavelength where the $P_{ref}$ is minimized. Then, the selected value is used to compare and adjust the series value. For example, when the low power RF tuning software is run, the system will find the optimum series value for a given capacitor by finding the series setting which maximizes a user selected parameter.

In some embodiments, depending on the process and/or substrate type used for processing in the substrate processing chamber 100, different wavelengths may be selected. For example, after processing a substrate under a first processing recipe, a different wavelength may be selected for plasma monitoring for a second substrate process recipe. In some cases, a different wavelength may be used for different substrate types processed in the substrate processing system.

Other embodiments of the present invention may provide methods and apparatuses that may be utilized to monitor and adjust the plasma in a substrate processing system by using a relationship between one or more non-reflected power methods, such as chamber pressure, substrate temperature, coil currents and/or voltage, electron-neutron mass ratio, phase and others in order to adjust and maintain a consistent plasma process. For example, in one embodiment, the substrate processing system 100 may provide for a consistent plasma by selecting a series value that corresponds to a maximum inner coil current.

Figure 6:
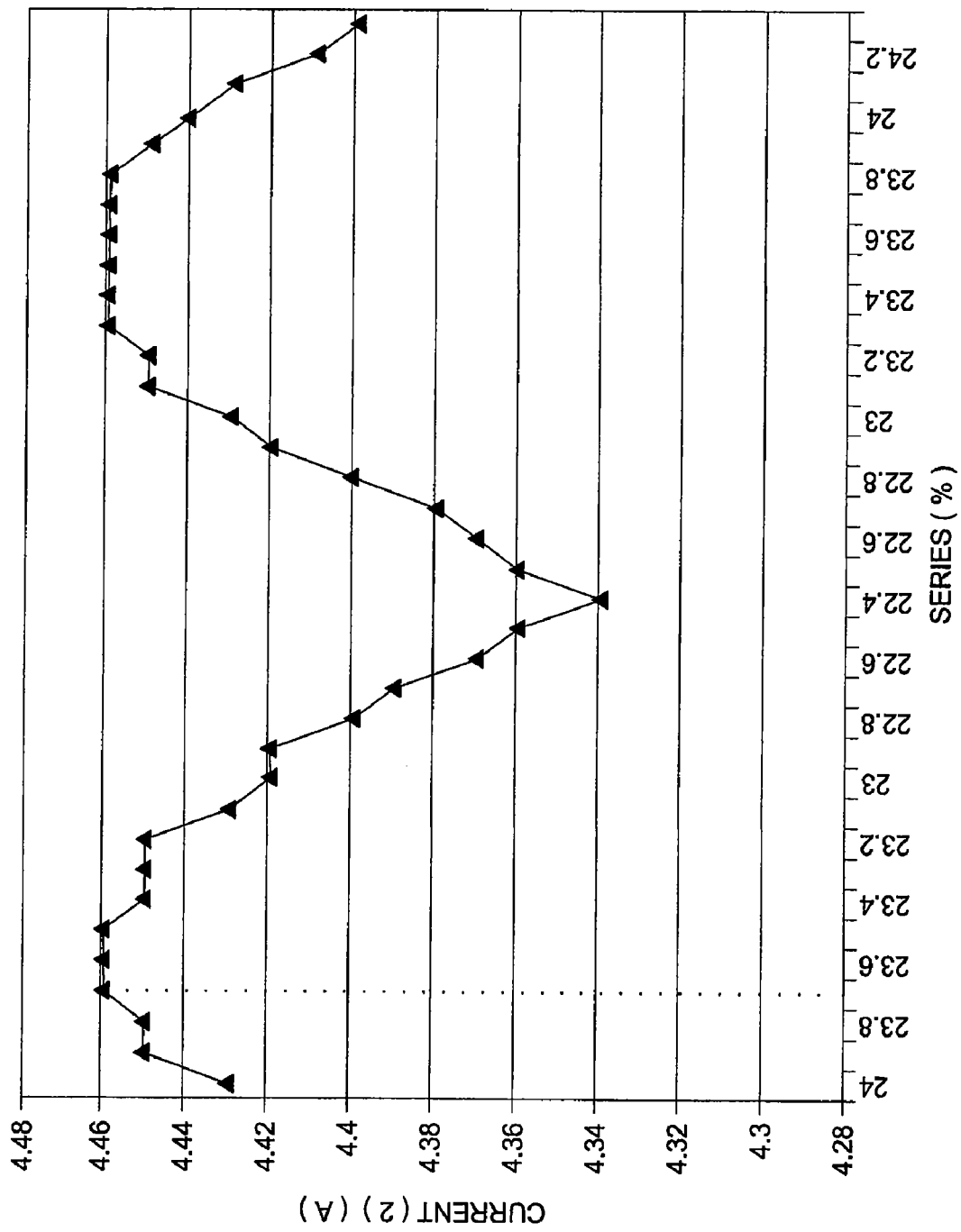
FIG. 6 illustrates a diagram of a match peak find according to another embodiment of the present invention.

FIG. 6 illustrates a diagram of a match peak find according to another embodiment of the present invention. As illustrated, the inner coil current (e.g., Current (2)) is compared with a series capacitor. The low power RF tuning software 180 is adapted to select series values that provide for a maximum coil current. Then the selected value is used to compare and/or adjust the series value. For example, when the low power RF tuning software is run, the system will find the optimum series value for a given capacitor (e.g., shunt capacitor) by choosing a series setting which maximizes a user selected parameter (e.g., Current (2)). It is contemplated that more than one variable may be monitored in order to adjust and maintain a consistent plasma. For example, in one embodiment, optimum match settings may correspond to the series and shut values at which, the reflected power is at minimum, the inner coil current and/or the wavelength intensities of a broadband electromagnetic reflect are at a maximum.

In other embodiments, the present invention may be used as a monitoring device to monitor the plasma. For example, the substrate processing system may monitor an expected response (e.g., a predetermined wavelength intensity). The computer 195 may monitor the reflected electromagnetic radiation and once a predetermined deviation from the expected response is detected, an alert may be sent to a computer system. In other embodiments, the computer 195 may utilize a dynamic loop and continually adjust the tuning circuits to maintain a predetermined wavelength intensity.

Figure 7:
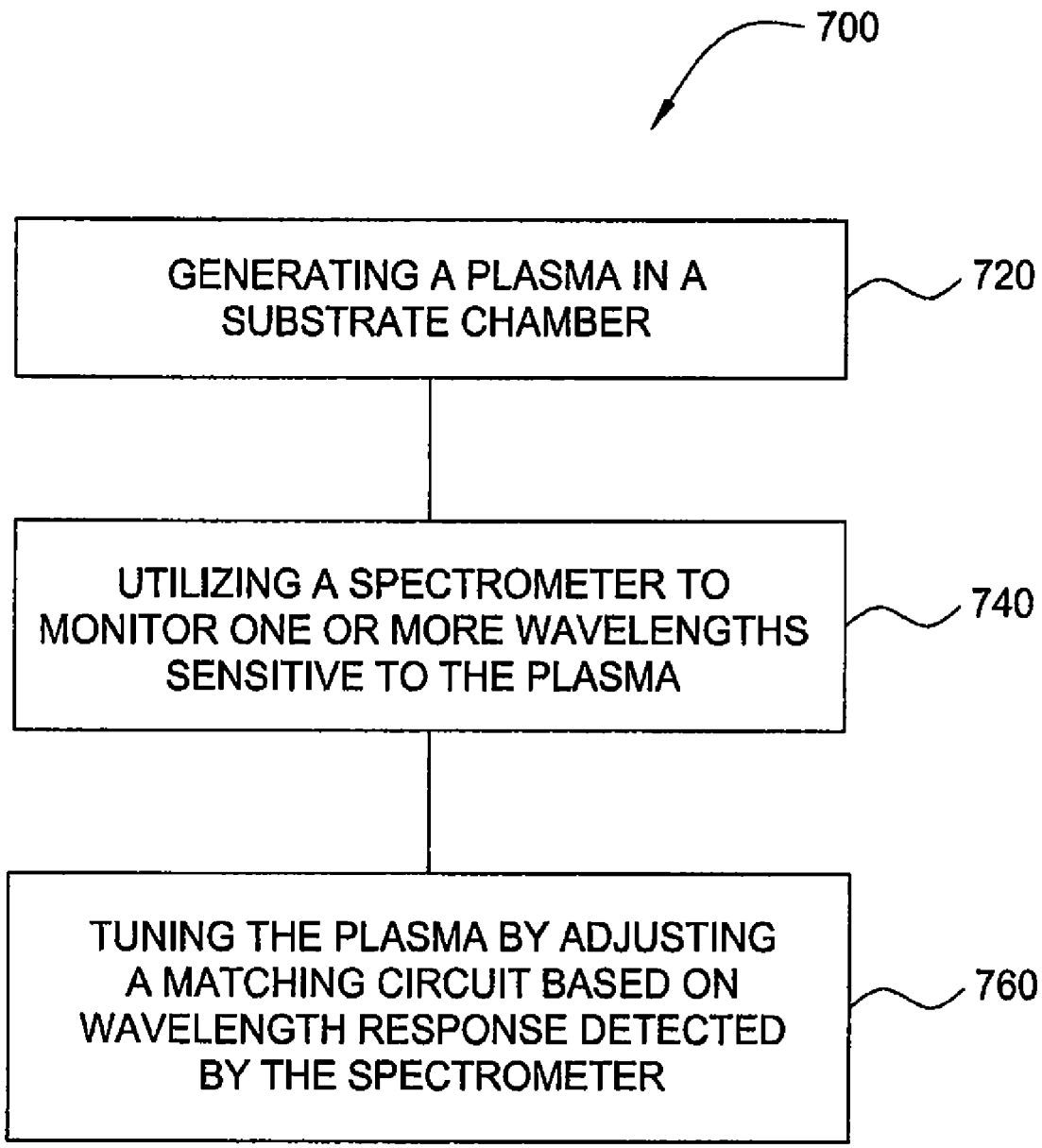
FIG. 7 illustrates a flow diagram of a processing method according to an embodiment of the present invention.

FIG. 7 illustrates operations 700 according to an implementation of the present invention. The operations of 700 may be performed, for example, by the controller 140. Moreover, various steps in the methods set forth below need not be performed or repeated on the same controller. These operations may be performed before and/or after processing of one or more substrates. Alternatively, in some cases, after cleaning of the substrate processing chamber, one or more of the following steps may be performed. In addition, the operations 700 may be understood with occasional reference to FIGS. 1, 4, 5 and 6.

The operations begin, at step 720, where plasma is generated within the substrate processing system 100. A substrate 114 may be placed on the pedestal 116 and process gases are supplied from a gas panel 138 through entry ports 126 to form a gaseous mixture 150. The gaseous mixture 150 is ignited into plasma in the chamber 110 by applying power from the RF power source 118 to the inductive coil element 112.

At step 740, the light reflected from the plasma may be detected and/or collected by a signal monitoring device via sensor 190 in the form of a light signal(s) and the signal may be transmitted by a signal cable 164 to the spectrometer 156. Then, the signal may be analyzed by the spectrometer 156 and the computer 195. At step 760, a low power RF tuning module (e.g., low power RF tuning software 180) may use one or more of such signals as input data and adjust the matching circuit, for example, by adjusting $C_1$ and/or $C_2$. In some embodiments, the analyzed results can be used to generate control commands to tune the plasma and adjust the matching circuit. In addition, the control commands may control the reactor chamber via controller 140. In order to monitor and adjust the plasma in a substrate processing system 100, the system may utilize a plasma data collecting assembly, adapted to measure properties of light over a specific portion of the electromagnetic spectrum.

In other embodiments, the present invention may utilize the relationship between chamber pressure, substrate temperature, or antenna current and the plasma in order to adjust and maintain a consistent plasma process. For example, the plasma monitoring assembly may monitor current through the outer antenna and the current through inner antenna (e.g., coil currents) in order to monitor and adjust the plasma. A current sensor may be used in the processing system to monitor and report the sensed current to the computer. Then, the low power RF tuning software may monitor the sensed current in the coils and accordingly adjust the series value to find an RF match peak. For example, the low power RF tuning software may sequence through a number of series values and monitor and/or record a decrease in the current. Then, after a predefined number of decreasing steps, locate a peak value. In one embodiment, the value may be recorded and used as a reference point for future tuning runs.

In some embodiments of the present invention, optimum match settings may correspond to the series and shut capacitor values where the reflected power is minimum, inner coil current is maximum and a broadband signal intensity is maximum. In addition, in other embodiments, the controller may monitor variables such as coil currents, broadband signal intensities, reflected power, chamber pressure and substrate temperature alone or in combination in order to provide for an optimum match settings. It is noted the present invention may utilize other parameters that can be mapped to plasma repeatability. In addition, it is also contemplated that other measurable characteristics of plasma may be used to provide for desired match settings.

Embodiments of the present invention provide methods and apparatuses that may be utilized to monitor and adjust the plasma in a substrate processing system. By using a plasma data monitoring assembly, information about the plasma may be monitored and then plasma may be adjusted. In some embodiments, a method may be realized by utilizing wavelength intensities sensitive to RF power that are generated within a chamber. Then, an electronic device, for example a computer software may analyze the wavelength intensities and a match circuit may then be adjusted. In this way, consistent plasma may be obtained. In other embodiments, the present invention may utilize the relationship between chamber pressure, coil currents, substrate temperature, and the plasma in order to adjust and maintain a consistent (e.g., repeatable) plasma process.

Although the embodiments disclosed above, which incorporate the teachings of the present invention, have been shown and described in detail herein, those skilled in the art can readily devise other varied embodiments which still incorporate the teachings and do not depart from the spirit of the invention.

The invention claimed is:

1. A method for controlling a plasma in a substrate processing system, comprising:
   controlling a first set of wavelength intensities of reflected electromagnetic radiation reflected from the plasma within a chamber before processing a first set of one or more substrates;
   associating the first set of wavelength intensities of reflected electromagnetic radiation to an RF power within the processing system;
   adjusting a matching circuit based on the first set of wavelength intensities of reflected electromagnetic radiation;
   processing the first set of one or more substrates in the substrate processing system;
   controlling a second set of wavelength intensities of reflected electromagnetic radiation reflected from the plasma within the chamber;
   associating the second set of wavelength intensities of reflected electromagnetic radiation to the RF power within the processing system; and
   adjusting the matching circuit based on the first or the second set of wavelength intensities of reflected electromagnetic radiation, while processing a second set of one or more substrates of a different type than the first set of one or more substrates.

2. The method of claim 1, wherein the second set of wavelength intensities is selected based on substrate type or process recipe.

3. The method of claim 1, wherein the electromagnetic radiation reflected from the plasma has a wavelength between about 200 nm and about 800 nm.

4. The method of claim 1, wherein the controlling the reflected electromagnetic radiation comprises utilizing a plasma data monitoring system.

5. The method of claim 4, wherein the plasma data monitoring system comprises an interferometer.

6. The method of claim 4, wherein the plasma data monitoring system comprises a spectrometer.

7. The method of claim 1, wherein the adjusting the match circuit is performed before and after performing a service maintenance.

8. The method of claim 1, wherein the substrate processing system is a plasma nitridation chamber.

9. The method of claim 1, wherein the RF power has an effective power of about 10 Watts to about 30 Watts.

10. A method for controlling a plasma in a substrate processing system, comprising:
- monitoring the plasma in a chamber from a position outside of the chamber utilizing a plasma data monitoring system;
- controlling a first set of wavelength intensities of reflected electromagnetic radiation reflected from the plasma within the chamber before processing a first set of one or more substrates;
- associating the first set of wavelength intensities of reflected electromagnetic radiation to an RF power within the processing system;
- adjusting a matching circuit based on the first set of wavelength intensities of reflected electromagnetic radiation;
- processing the first set of one or more substrates in the substrate processing system;
- controlling a second set of wavelength intensities of reflected electromagnetic radiation reflected from the plasma within the chamber;
- associating the second set of wavelength intensities of reflected electromagnetic radiation to the RF power within the processing system; and
- adjusting the matching circuit based on the first or the second set of wavelength intensities of reflected electromagnetic radiation, while processing a second set of one or more substrates that are a different type than the first set of one or more substrates.

11. The method of claim 10, wherein the plasma data monitoring system comprises an interferometer.

12. The method of claim 10, wherein the plasma data monitoring system comprises a spectrometer.

13. The method of claim 10, wherein the plasma is generated by applying RF power to one or more coil elements disposed outside of the chamber.

14. The method of claim 13, further comprising adjusting one or more capacitors coupled to the one or more coil elements to maintain the repeatable plasma condition.

15. The method of claim 13, wherein the RF power has an effective power of about 5 Watts to about 30 kilo Watts.

16. A method for controlling a plasma in a substrate processing system, comprising:
- generating a plasma within a chamber by applying RF power to one or more coil elements disposed outside of the chamber;
- controlling a first set of wavelength intensities of reflected electromagnetic radiation reflected from the plasma within the chamber before processing a first set of one or more substrates;
- associating the first set of wavelength intensities of reflected electromagnetic radiation to an RF power within the processing system;
- adjusting a matching circuit based on the first set of wavelength intensities of reflected electromagnetic radiation;
- processing the first set of one or more substrates in the substrate processing system;
- controlling a second set of wavelength intensities of reflected electromagnetic radiation reflected from the plasma within the chamber;
- associating the second set of wavelength intensities of reflected electromagnetic radiation to the RF power within the processing system; and
- adjusting the matching circuit based on the first or the second set of wavelength intensities of reflected electromagnetic radiation, while processing a second set of one or more substrates, the second set of one or more substrates being of a different type than the first set of one or more substrates, wherein the adjusting the matching circuit comprises adjusting one or more capacitors coupled to the one or more coil elements.

17. The method of claim 16, wherein the RF power has an effective power of about 5 Watts to about 30 kilo Watts.

18. The method of claim 16, wherein the second set of wavelength intensities is selected based on substrate type or process recipe.

* * * * *